(12) United States Patent
Mancini et al.

(10) Patent No.: US 12,501,841 B2
(45) Date of Patent: Dec. 16, 2025

(54) HIGH DENSITY INTERCONNECTS FOR ARRAYS OF JOSEPHSON TRAVELING WAVE PARAMETRIC DEVICES

(71) Applicant: INTERNATIONAL BUSINESS MACHINES CORPORATION, Armonk, NY (US)

(72) Inventors: Corrado P. Mancini, Hopewell Junction, NY (US); David Lokken-Toyli, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 916 days.

(21) Appl. No.: 17/722,292

(22) Filed: Apr. 15, 2022

(65) Prior Publication Data

US 2023/0337552 A1    Oct. 19, 2023

(51) Int. Cl.
  *H10N 60/81*   (2023.01)
  *H01L 23/00*   (2006.01)
  *H03F 19/00*   (2006.01)
  *H05K 1/18*    (2006.01)
  *H10N 60/01*   (2023.01)

(52) U.S. Cl.
  CPC ........... *H10N 60/815* (2023.02); *H01L 24/14* (2013.01); *H01L 24/16* (2013.01); *H03F 19/00* (2013.01); *H05K 1/181* (2013.01); *H10N 60/0912* (2023.02); *H01L 2224/14177* (2013.01); *H01L 2224/16225* (2013.01)

(58) Field of Classification Search
  CPC .................. H10N 60/815; H10N 60/0912
  See application file for complete search history.

(56) References Cited

U.S. PATENT DOCUMENTS

| 10,978,425 B2 | 4/2021 | White |
| 10,998,486 B1 | 5/2021 | Martinis |
| 11,152,707 B1 | 10/2021 | Janett et al. |
| 2003/0040440 A1* | 2/2003 | Wire ............... H01P 1/047 333/99 S |
| 2008/0017873 A1* | 1/2008 | Tomoda ............ H01L 24/83 257/E23.021 |

(Continued)

FOREIGN PATENT DOCUMENTS

WO    2021026070 A1    2/2021

OTHER PUBLICATIONS

Abdo, B. "Rising Above the Noise: Quantum-Limited Amplifiers Empower the Readout of IBM Quantum Systems"; Quantum Computing (2022); 12 pgs.

(Continued)

*Primary Examiner* — Paul A Wartalowicz
(74) *Attorney, Agent, or Firm* — Amin, Turocy & Watson, LLP

(57) ABSTRACT

A superconducting electrical device includes one or more traveling-wave parametric amplifiers (TWPAs) on a chip that is electrically connected to a wiring layer of a substrate. The electrical connection of the chip to the wiring layer of the substrate includes, for each of the one or more TWPAs, a signal bump-bond between the TWPA and the substrate. There is a peripheral ring of ground bumps around the signal bump between the TWPA and the substrate.

20 Claims, 7 Drawing Sheets

(56) References Cited

U.S. PATENT DOCUMENTS

| | | | | |
|---|---|---|---|---|
| 2008/0135991 A1* | 6/2008 | Harnden | ........... | H01L 23/49503 |
| | | | | 257/E21.001 |
| 2009/0001548 A1* | 1/2009 | Osanai | .................... | H01L 23/50 |
| | | | | 257/E23.079 |
| 2019/0229690 A1* | 7/2019 | White | .................... | G06N 10/40 |
| 2020/0350880 A1* | 11/2020 | Miano | .................... | H10N 60/12 |
| 2021/0264308 A1 | 8/2021 | Sandberg et al. | | |
| 2021/0305315 A1 | 9/2021 | Solgun et al. | | |
| 2021/0399044 A1 | 12/2021 | Gumann et al. | | |

OTHER PUBLICATIONS

Macklin, C. et al., "A Near-Quantum-Limited Josephson Traveling-Wave Parametric Amplifier"; Science Express (2015); 8 pgs.

Basili, S., "Development of Josephson Parametric Amplifiers for Quantum Applications"; Master Thesis (2020); 67 pgs.; Delft University of Technology, TNO Quantum Technology Department; Delft, Netherlands.

O'Brien, K., Quantum Coherent Electronics Group at MIT, "Research Overview, Quantum Metamaterials"; downloaded Mar. 28, 2022 from https://qce.mit.edu.research.html; 2 pgs.

Lanes, O. "The Quantum Aviary"; downloaded Mar. 28, 2022 from https://thequantumaviary.blogspot.com/2020/11/what-does-it-take-to-read-out-quantum.html; 4 pgs.

Wenner, J. et al., "Wirebond Crosstalk and Cavity Modes in Large Chip Mounts for Superconducting Qubits"; Supercond. Sci. Technol. 24 (2011); 7 pgs.

White, T.C., et al., "Traveling Wave Parametric Amplifier with Josephson Junctions using Minimal Resonator Phase Matching"; arXiv:1503.04364v1 [cond-mat.supr-con] (2015); 15 pgs.

Mancini. C. et al., "Abstract: E33.00006: Optimized dispersion engineering of coplanar-waveguide-based Josephson traveling-wave parametric amplifiers"; APS March Meeting 2021; 2 pgs.

Feng, D.C. et al., "Design and Measurement of a Joseph-Son Traveling Wave Parametric Amplifier Fabricated in a Superconducting Qubit Process", in 2020 IEEE/MTT-SInternational Microwave Symposium (IMS)(2020) pp. 940-943.

Ranzani, L. et al., "Wideband Isolation by Frequency Conversion in a Josephson-Junction Transmission Line". Phys. Rev. Applied 8, 054035—Published Nov. 17, 2017; 7 pgs.

Planat, L. et al., "Photonic-Crystal Josephson Traveling-Wave Parametric Amplifier", Phys.Rev. (2020), 19 pgs.

* cited by examiner

HIGH DENSITY INTERCONNECTS FOR ARRAYS OF JOSEPHSON TRAVELING WAVE PARAMETRIC DEVICES

BACKGROUND

Technical Field

The present disclosure generally relates to quantum circuits, and more particularly, to high density interconnects for quantum circuits.

Description of the Related Art

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state.

Qubits can suffer from an inherent tradeoff between isolation and access. On the one hand, to achieve long coherence, qubits are isolated from the noisy environment. On the other hand, if they are too isolated, it can be not easy to control and measure them. For superconducting qubits to be in the superconducting state, have low noise environment, and have large isolation from the external world, they are typically cooled down to ultra-low temperatures using a cryogenic environment, sometimes referred to as a dilution fridge. However, to control and read out these qubits, mounted at the base-temperature stage of dilution fridges, microwave signals need to communicate between the qubits and the classical electronics controlling them at room temperature. These microwave signals are carried by input and output chains devised to minimize qubits' exposure to noise. Such chains typically run through the different temperature stages of the dilution fridge and include multiple microwave components, such as coaxial lines, filters, attenuators, isolators, and low-noise amplifiers. Maintaining signal integrity in the entire chain is a salient consideration. In order to scale superconducting qubit systems toward large qubit counts (e.g., 1000 or more) advanced packaging techniques are required that are sensitive to various signaling considerations and quantum phenomena that may not have analogs in the world of classical computing.

SUMMARY

According to one embodiment, a superconducting electrical device includes Josephson junction traveling-wave parametric circuits (JJTWPCs) on a chip that is electrically connected to a wiring layer of a substrate. The electrical connection of the chip to the wiring layer of the substrate includes, for each of the one or more JJTWPCs, a signal bump-bond between the JJTWPC and the substrate. There is a peripheral ring of ground bumps around the signal bump between the JJTWPC and the substrate. By virtue of using bump bond interconnects, a higher density JJTWPC chip having an improved crosstalk and a more flexible layout can be achieved, which improves JJTWPC stability through improved impedance matching.

In one embodiment, the one or more JJTWPCs are traveling-wave parametric amplifiers (TWPAs).

In one embodiment, the one or more JJTWPCs are traveling-wave frequency converters.

In one embodiment, the substrate is a multi-layer printed circuit board (PCB).

In one embodiment, the PCB includes one or more built in directional couplers.

In one embodiment, a pitch between the signal bump-bonds is less than 10 mm. The pitch can be 2 to 3 mm, thereby providing a more efficient TWPA array on the chip while maintaining a crosstalk of less than −50 dB between adjacent signal bump bonds.

In one embodiment, at least one of the signal bump-bonds of the one or more JJTWPCs is more than 1 mm from an edge of the chip. This signal bump-bond that is more than 1 mm from the edge of the chip can have a stray inductance that is less than 1 nH. Accordingly, unlike wire-bond implementations that rely on electrical interconnects on the periphery of a chip, the teachings herein can accommodate I/O connections nearly anywhere on the chip.

In one embodiment, at least one of the signal bump-bonds of the one or more JJTWPCs are at a vertical and/or horizontal center row of the chip.

According to one embodiment, a method of interfacing with one or more Josephson junction traveling-wave parametric circuits (JJTWPCs), includes providing a substrate and electrically connecting one or more JJTWPCs on a chip to a wiring layer of the substrate. The electrical connection of the chip to the wiring layer of the substrate includes, for each of the one or more JJTWPCs, providing a signal bump-bond between the JJTWPC and the substrate and a peripheral ring of ground bumps around the signal bump between the JJTWPC and the substrate.

In various embodiments, the one or more JJTWPCs are traveling-wave parametric amplifiers (TWPAs) and/or traveling-wave frequency converters.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1:
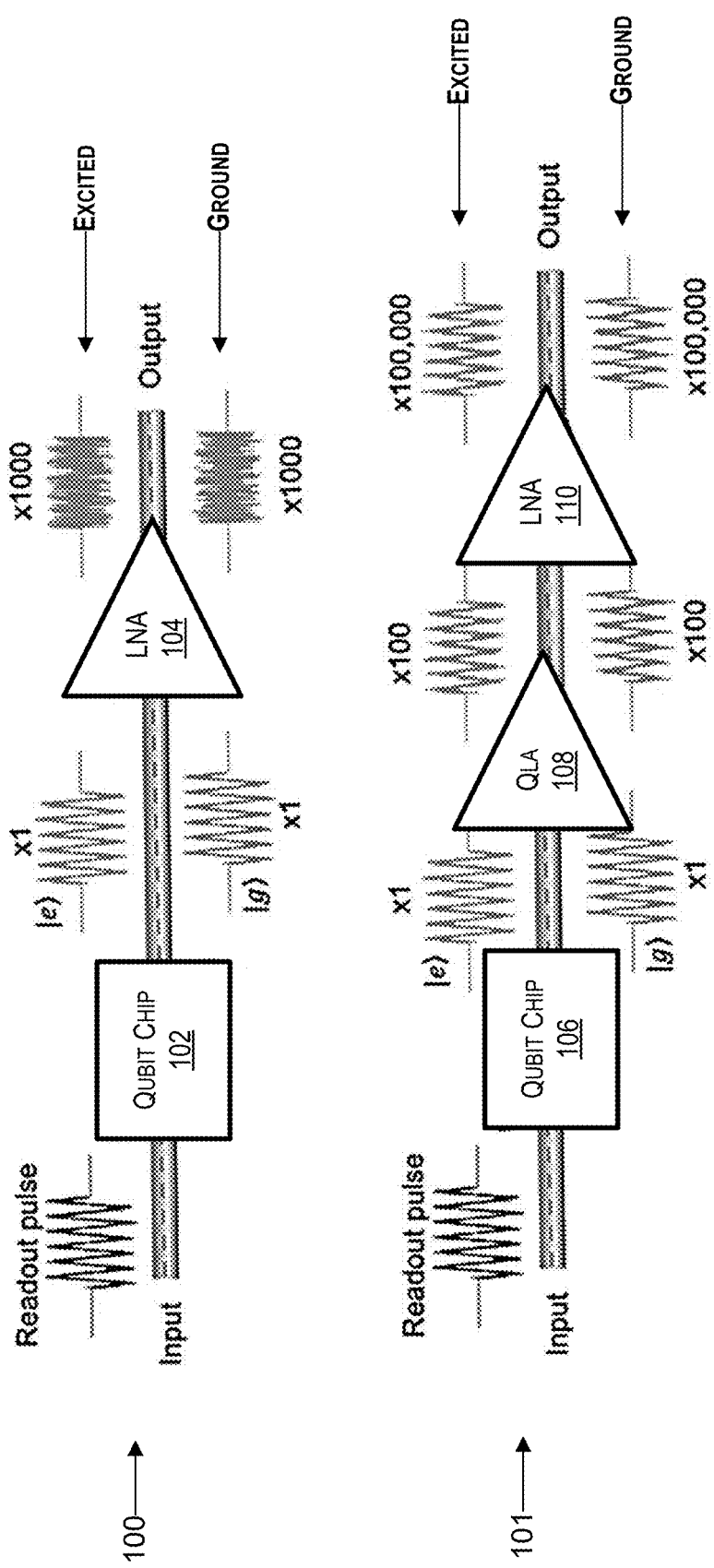
FIG. 1 provides a qubit readout architecture that does not include a quantum limited amplifier and one that does, respectively, consistent with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

As used herein, certain terms are used indicating what may be considered an idealized behavior, such as "lossless," "superconductor," "superconducting," "absolute zero," which are intended to cover functionality that may not be exactly ideal but is within acceptable margins for a given application. For example, a certain level of loss or tolerance may be acceptable such that the resulting materials and structures may still be referred to by these "idealized" terms.

Although the terms first, second, third, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope. It should be appreciated that the figures and/or drawings accompanying this disclosure are exemplary, non-limiting, and not necessarily drawn to scale.

In one aspect, spatially related terminology such as "front," "back," "top," "bottom," "beneath," "below," "lower," above," "upper," "side," "left," "right," and the like, is used with reference to the direction of the Figures being described. Since components of embodiments of the disclosure can be positioned in a number of different directions, the directional terminology is used for purposes of illustration and is in no way limiting. Thus, it will be understood that the spatially relative terminology is intended to encompass different directions of the device in use or operation in addition to the direction depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other directions) and the spatially relative descriptors used herein should be interpreted accordingly.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

In discussing the present technology, it may be helpful to describe various salient terms and example environment of operation. As used herein a qubit represents a quantum bit and a quantum gate is an operation performed on a qubit, such as controlling the superposition of qubit states or entanglement of two qubits.

A quantum processor (Q-processor) uses the unintuitive nature of entangled qubit devices (compactly referred to herein as "qubit," or plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the ON and OFF states (equivalent to 1 and 0 in binary code), a quantum processor harnesses these quantum states of matter to output signals that are usable in data computing.

The present disclosure generally relates to superconducting devices, and more particularly, to methods and systems that facilitate a scalable interconnected quantum architecture. The electromagnetic energy associated with a qubit state can be contained in the qubit architecture, which can include Josephson junctions, as well as capacitive and inductive elements. A Josephson junction (JJ) is a quantum mechanical device that is made of two superconducting electrodes separated by a barrier. A Josephson Transmission Line (JTL) is a connector that is operative to transfer quantum information.

By way of comparison, FIG. 1 provides a qubit readout architecture that does not include a QLA and one that does (i.e., 100 and 101, respectively), consistent with an illustrative embodiment. To read out the qubit state, a microwave signal is applied to the microwave readout cavity that couples to the qubit of a qubit chip 102 at the cavity frequency. The transmitted (or reflected) microwave signal can go through multiple thermal isolation stages and one or more low-noise amplifiers (e.g., LNA 104) that are used to block or reduce the noise and improve the signal-to-noise ratio (SNR). Alternatively, or in addition, a microwave signal (e.g., pulse) can be used to entangle two or more qubits. Much of the process may be performed in a cold environment (e.g., in a cryogenic chamber), while the microwave signal of a qubit (e.g., at the output) may ultimately be measured at room temperature with a classical computing device.

The amplitude and/or phase of the returned/output microwave signal carries information about the qubit state, such as whether the qubit is in the ground or excited state. The microwave signal carrying the quantum information about the qubit state is usually weak (e.g., on the order of a few microwave photons). To measure this weak signal with room temperature electronics (i.e., outside the refrigerated environment), low-noise quantum-limited amplifiers (QLAs) 108, such as Josephson amplifiers (e.g., Josephson parametric amplifiers (JPA)) and Josephson travelling-wave parametric amplifiers (JTWPAs), may be used as preamplifiers (i.e., first amplification stage) at the output of the quantum system to boost the quantum signal and improve the signal to noise ratio (SNR) of the output chain, while adding the minimum amount of noise as dictated by quantum mechanics.

A QLA can be described as a lossless nonlinear electromagnetic medium, whose physical properties, such as resonance frequencies or mutual couplings, are parametrically modulated by a strong coherent microwave tone called the pump, which serves as the energy source for the amplification of a TWPA. QLAs use a strong pump tone (e.g., much higher power than the amplified signal) to modulate the Josephson potential and produce gain. Specifically, JTWPAs may use a four-wave mixing process that results in the pump tone being relatively close in frequency to the signal band.

Further, a JTWPA is a non-resonant amplifier, which means it is broad bandwidth with no inherent filtering on its input. The combination of a being near a pump and having a wide bandwidth means that JTWPAs placed in close physical proximity to each other may require very low crosstalk to allow adjacent TWPAs to be pumped at independent frequencies. For example, when TWPAs are operated at the preferred 20 dB of gain this crosstalk might be less than −50 dB to avoid modifying the dynamics of an adjacent amplifier. For example, $P_{pump}$−65 dBm and $P_{1\ dB}$ −105 dBm are typical, so it is desired that the stray signals to be −115 dBm or less.

A JTWPA is a directional amplifier in that it amplifies signals that co-propagate with the pump due to the large phase mismatch for signals that counter-propagate relative to the pump. However, JTWPAs generally do not provide isolation in the reverse direction. Accordingly, they appear as a microwave thru connection in the reverse direction, up to the insertion loss of the device. Consequently, JTWPAs can be sensitive to reflections (e.g., impedance mismatches) at the input and output of the device. If such reflections are present, they can lead to parasitic oscillations and prevent the amplifier from achieving large forward gains. In one aspect, the teachings herein provide better impedance matching between an input and an output of a TWPA, thereby alleviating many of the foregoing concerns and others.

In addition to Josephson amplifiers, such as Josephson parametric amplifiers (JPAs), Josephson Directional amplifiers (JDAs), Josephson parametric converters (JPCs), and Josephson travelling-wave parametric amplifiers (JTWPAs), that can be used in scalable quantum processor, there are microwave components that use Josephson mixers, such as Josephson circulators, and Josephson isolator (JIS) devices. JTWPAs are a form of quantum-limited amplifier. For example, a JTWPA is a QLA that can be generated by a nonlinear transmission line formed by series Josephson junctions interrupted by lumped element capacitance to ground. As mentioned above, injecting a large microwave pump tone into the device modulates the Josephson potential, producing a four-wave-mixing process that leads to amplification. The pump tone powers the JTWPA. In one embodiment, such devices may include thousands of series junctions and shunt capacitors to provide sufficient electrical length to achieve typical gain targets (20 dB of power gain). QLAs are used to improve signal to noise ratio (SNR) in qubit measurements, thereby allowing higher fidelity qubit measurement and lower power qubit measurements (higher measurement powers correlate with higher qubit disturbance).

As used herein, four-wave-mixing refers to the fact that for an input signal at frequency $\omega_s$, and pump frequency $\omega_p > \omega_s/2$. To satisfy energy conservation the JTWPA produces an additional intermodulation at frequency $\omega_{idler} = 2\omega_p - \omega_s$. For example, two pump photons are converted to a signal photon and an "idler" photon, thus the four waves.

In some scenarios, JTWPAs can use a technique called dispersion engineering, which relates to the use periodic resonators to ground along the length of the transmission line that adjust the phase of the pump tone along the transmission line to achieve phase matching along the length of the transmission line. This technique is salient to achieving exponential gain versus length in the device. Phase matching is represented by the expression $2k_p - k_s - k_i$, where $k_{p,s,i}$ represents the wavevector of the pump, signal, or idler.

Since amplifiers (e.g., LNA 104) can add noise in addition to the input noise accompanying the weak signals, amplification comes at the cost of adding appreciable noise to the amplified output. This could be problematic because the noise added by typical high-gain, low-noise semiconductor-based amplifiers, can be overwhelming (e.g., about 10-20 times larger than the quantum signal itself) in architecture 100. However, by virtue of using a QLA 108 in the first-stage amplification in the output chain, as illustrated in architecture 101, the SNR can be substantially improved (e.g., by a factor of 100 as illustrated in FIG. 1). These microwave amplifiers are quantum-limited because they add only a very small (e.g., minimum) amount of noise required by quantum mechanics to the input signal, which equals to the ambient quantum noise, (i.e., a half of a photon at the signal frequency). Accordingly, in an ideal case, the SNR at the output of the QLA 108 is only degraded by a factor of two (e.g., since the added noise and input noise are equal). Stated differently, QLA 108, typically a superconducting device also at the mixing chamber plate (MXC), amplifies both the signal and input noise such that the added noise from the LNA makes minimal impact on the overall SNR of the measurement.

A qubit system may include one or more readout resonators coupled to the qubit. A readout resonator may be a transmission line with a finite length that includes a capacitive connection to an external feedline on one side and is either shorted to the ground on the other side, such as for a quarter wavelength resonator, or may have a capacitive connection to ground, such as for a half wavelength resonator, which results in oscillations within the transmission line, with the resonant frequency of the oscillations being detuned from the frequency of the qubit. For example, the qubit state can affect a pulse coming from the control/measurement instruments at the readout resonator frequency and transmitted through or reflected off the readout resonator. The pulse can act as a measurement of the qubit.

Between qubits there may be a coupling resonator, sometimes referred to herein as a coupler resonator or RIP bus, which allows coupling different qubits together in order to realize quantum logic gates, sometimes referred to herein as entanglement. The coupling resonator is typically structurally similar to the readout resonator. However, more complex designs are possible. When a qubit is implemented as a transmon, each side of the coupling resonator may be coupled (e.g., capacitively or inductively) to a corresponding qubit by being in adequate proximity to (e.g., the capacitor of) the qubit. Since each side of the coupling resonator has coupling with a respective different qubit, the two qubits are coupled together through the coupling resonator (e.g., RIP bus). In this way, there can be mutual interdependence in the state between coupled qubits, thereby allowing to use the state of one qubit to control the state of another qubit. As used herein the term entanglement refers to when an interaction between two qubits is such that the states of the two cannot be specified independently, but can only be specified for the whole system. In this way, the states of two qubits are linked together.

The ability to include more qubits is salient to being able to realize the potential of quantum computers. The more qubits in a quantum processor, the more states can in principle be manipulated and stored. To improve fault tolerance of a quantum computer, a large number of physical qubits should be used to store a logical quantum bit. In this way, the local information is delocalized such that the quantum computer is less susceptible to local errors and the performance of measurements in the qubits' eigenbasis, similar to parity checks of classical computers, thereby advancing to a more fault tolerant quantum bit. Scaling superconducting qubit systems towards large qubit counts (e.g., 1000+) benefits from improved QLA/JTWPA packaging. Known JTWPAs typically use wire-bond interconnects to a surrounding printed circuit board (PCB), typically packaged in a copper housing with coaxial RF connectors like Sub-Miniature version A (SMA), or similar interconnects. The wire-bond interconnects lead to three main limitations that are addressed by the teachings herein, namely (i) crosstalk, (ii) high density layout, and (iii) impedance matching.

Regarding crosstalk, wire-bonds can lead to high crosstalk in large quantum device chips. For example, to allow nearby JTWPAs to be pumped at distinct frequencies, the desired crosstalk might be below −50 dB so that crosstalk from the pump of one JTWPA does not act as a spurious signal that saturates an adjacent JTWPA given typical device parameters.

Regarding high density layout, the limitation in known systems is that wire-bonds should be short, such that inputs and outputs remain at the edge of the chip to satisfy impedance matching, and far separated to achieve sufficient crosstalk, significantly limit the ability to create small chips with dense TWPA layout (e.g., I/O ports within the center of the chip).

As to impedance matching, wire-bonds have a large inductance (e.g., on the order of a pH/um). Thus, typical wire-bond lengths of hundreds of um can lead to hundreds of pH of stray inductance at the input and output of the JTWPA. Given the sensitivity of JTWPAs to their input and output impedance, this stray inductance can lead to increased gain ripple and increased sensitivity of the gain profile to the pump frequency and power. Large qubit systems can include over 100 QLAs, and the crosstalk, impedance matching, distance to the edge of the chip (e.g., <1 mm from chip edge) limitations of wire-bonds, can limit their efficacy in high density and modular applications. In one aspect, the teachings herein address the above concerns and others by providing bump-bonded JTWPAs that utilize a bump process in associated parametric amplifiers. By virtue of using bump bond interconnects as taught herein, a higher density TWPA chip having an improved crosstalk and a more flexible layout can be achieved, which improves TWPA stability through improved impedance matching.

In one aspect, the teachings herein are based on Inventors' insight that directly applying conventional integrated circuit techniques for interacting with computing elements to superconducting quantum circuits may not be effective because of the unique challenges presented by quantum circuits that are not presented in classical computing architectures. Accordingly, embodiments of the present disclosure are further based on recognition that issues unique to quantum circuits have been taken into consideration when evaluating applicability of conventional integrated circuit techniques to building superconducting quantum circuits, and, in particular, to electing methods and architectures used for interacting efficiently with qubits and providing a scalable and modular quantum processor architecture that can support thousands or millions of superconducting physical qubits. The techniques described herein may be implemented in a number of ways. Example implementations are provided below with reference to the following figures.

Example Interconnecting Systems

Figure 2:
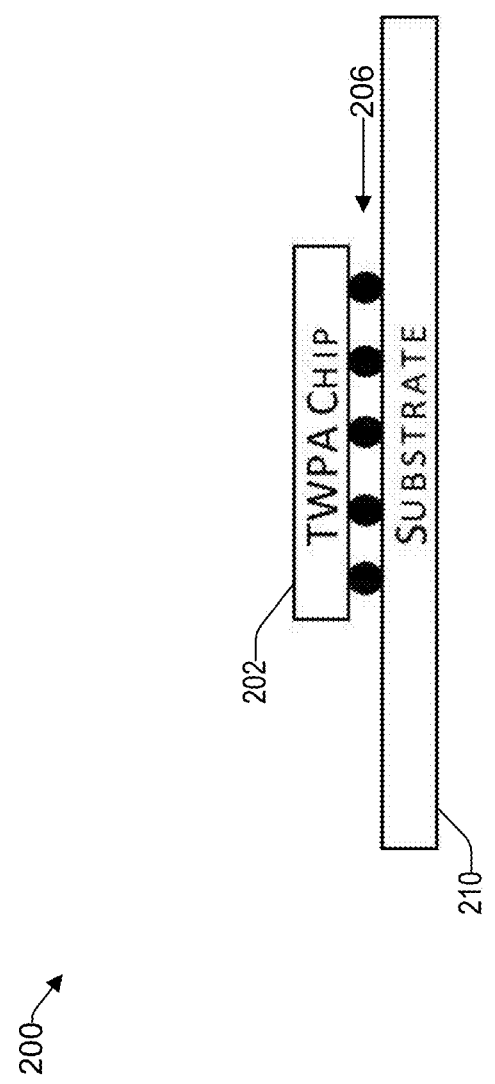
FIG. 2 is an example interconnect system using bump-bonds to connect to a traveling-wave parametric amplifier chip, consistent with an illustrative embodiment.

Reference now is made to FIG. 2, which is an example interconnect system 200 using bump-bonds 206 to connect to TWPA chip, consistent with an illustrative embodiment. For example, the bump-bonds 206 are solder bumps (e.g., small spheres of solder) that are bonded to a bottom surface of the TWPA chip 202. The TWPA chip is then aligned so that its pads align with the pads of the substrate. The electrical interconnect is made (e.g., via reflow or thermocompression bonding) between the TWPA chip 202 and the substrate 210.

In various aspects, the substrate 210 can comprise any suitable chip/wafer/semiconductor material that can be used to communicate with the TWPA chip 202. In various embodiments, the substrate 210 can comprise any suitable size, shape, and/or dimensions and serve as a foundation onto which to electrically couple the TWPA chip 202 via the bump-bonds 206. In one embodiment, the substrate may include (e.g., have embedded therein) circuit components. The substrate can also be used to route signal traces into launch footprints compatible with coaxial, board-to-board, and/or flex connectors.

Figure 3:
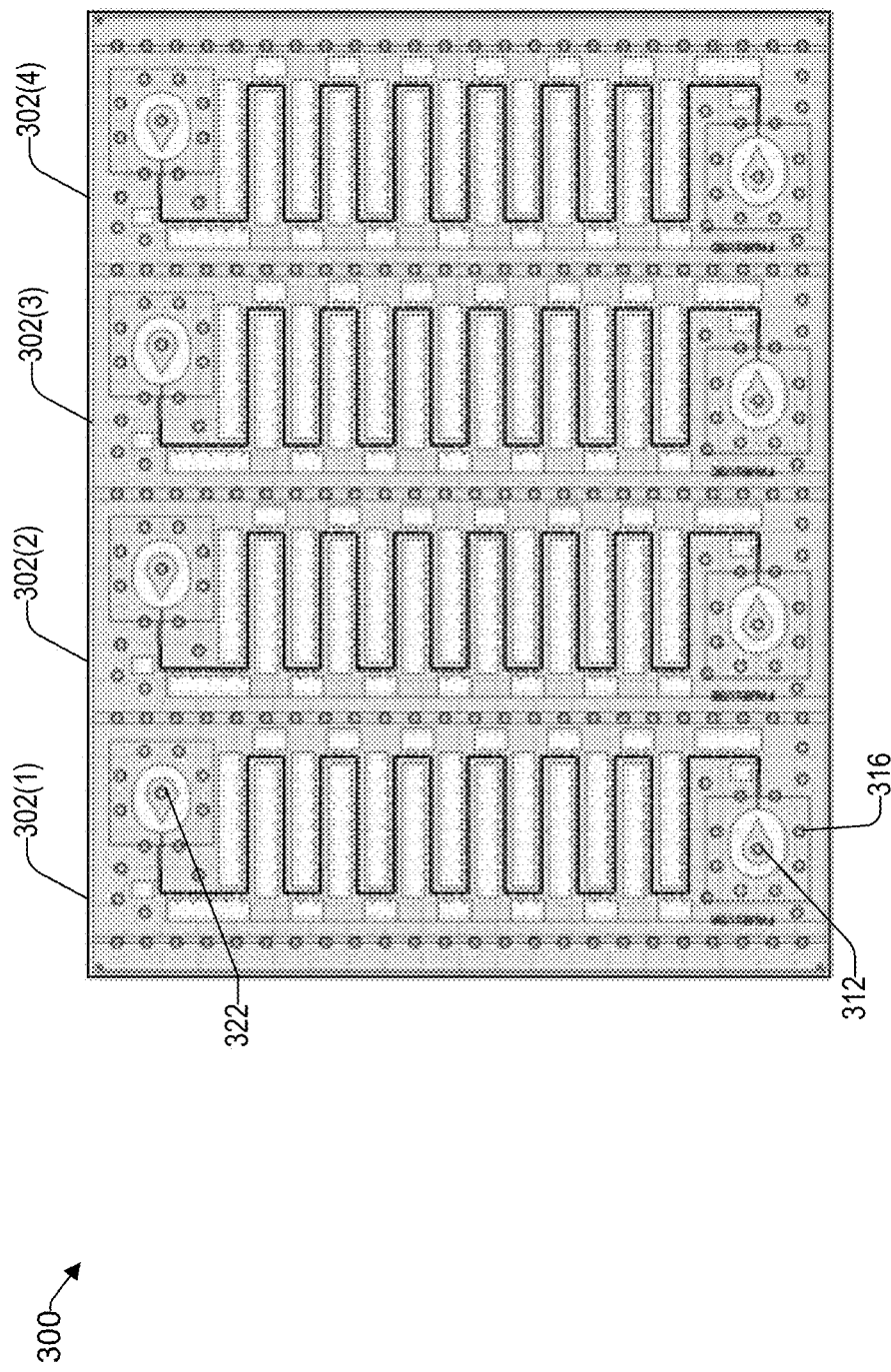
FIG. 3 illustrates a traveling-wave parametric amplifier chip that includes four traveling-wave parametric amplifiers and is configured to be coupled to a substrate, consistent with an illustrative embodiment.

In one embodiment, the TWPA chip 202 may include a plurality TWPAs and the substrate is a multi-layer printed circuit board (PCB). In this regard, FIG. 3 illustrates a TWPA chip 300 that includes four TWPAs 302(1) to 302(4) and is configured to be coupled to a substrate (e.g., PCB), consistent with an illustrative embodiment. Each TWPA can have an input port (e.g., 312) and an output port (e.g., 322). Each port can have a center bump bond (e.g., 312) for the signal and a plurality of surrounding (e.g., peripheral ring of) bumps (e.g., 316) for ground (e.g., to provide sufficient signal isolation). Accordingly, the multi-TWPA layout can include grounding bump-bonds and adequate spacing between adjacent signal bump pads and devices such that the pump and signal crosstalk are below a predetermined threshold (e.g., minimized for particular applications). While FIG. 3 illustrates the bump bonds to be at the periphery of the chip (e.g., top and bottom portion), the location of the bump-bonds is not limited thereto. The bump-bonds discussed herein can be placed in any suitable location on the chip, including the center, as discussed in more detail later. Accordingly, by virtue of using bump bonds, a more compact and flexible architecture is facilitated having a small device pitch, something that would not be achievable in a wire bond implementation. In one embodiment, the spacings (i.e., pitch) between center interconnects can be in a 2 mm to 10 mm range.

Figure 4:
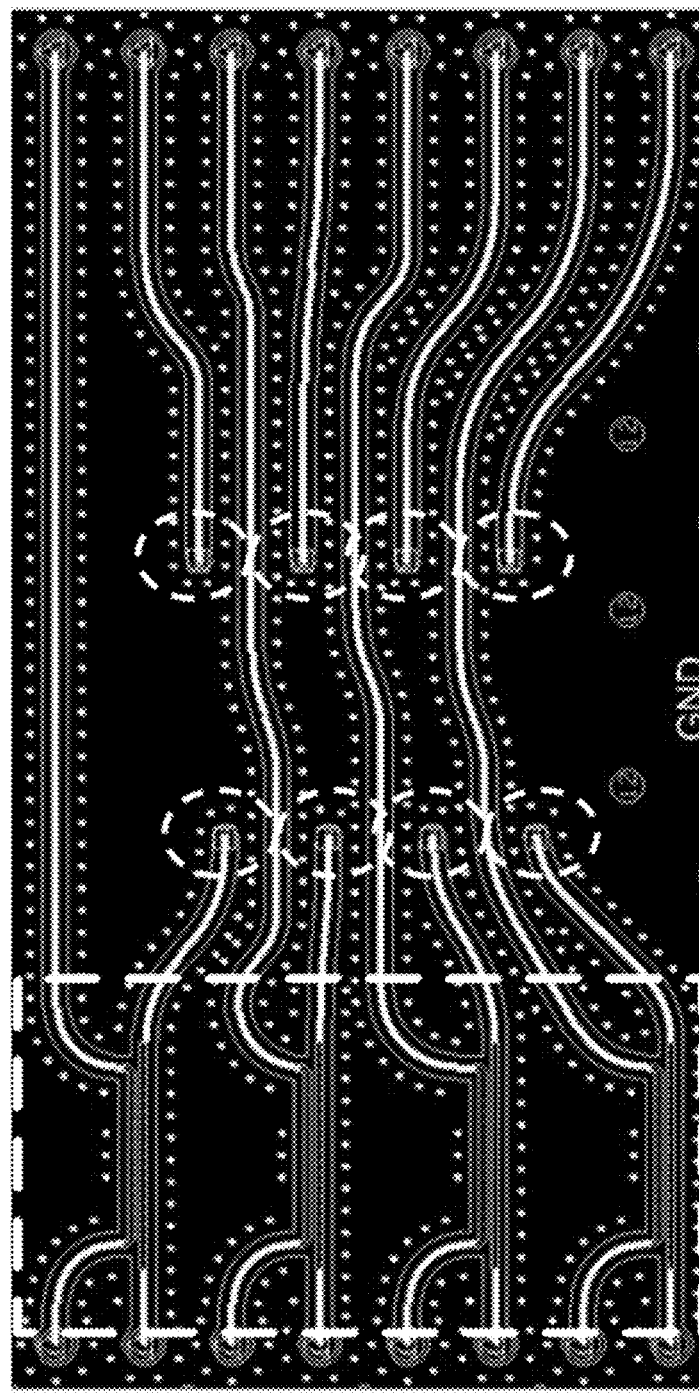
FIG. 4 is a printed circuit board that includes built-in directional couplers to couple in the individual pump tones for each traveling-wave parametric amplifier electrically connected thereto, consistent with an illustrative embodiment.

For example, the TWPA chip 300 can be coupled to a substrate that is a multi-layer printed circuit board (PCB). In this regard, reference is made to FIG. 4, which is a PCB 400 that includes built-in directional couplers 402 to couple in the individual pump tones for each TWPA electrically connected thereto, consistent with an illustrative embodiment. Stated differently, the PCB may include embedded circuit components, such as directional couplers. The chip in FIG. 3 can be bonded to the PCB 400 with the signal pads (312 and 322) connected through bump bonds to the signal pads shown in the center of the PCB 400. For example, the signal pads of FIG. 3 can couple to the receiving signal pads (circled) in FIG. 4.

Figure 5:
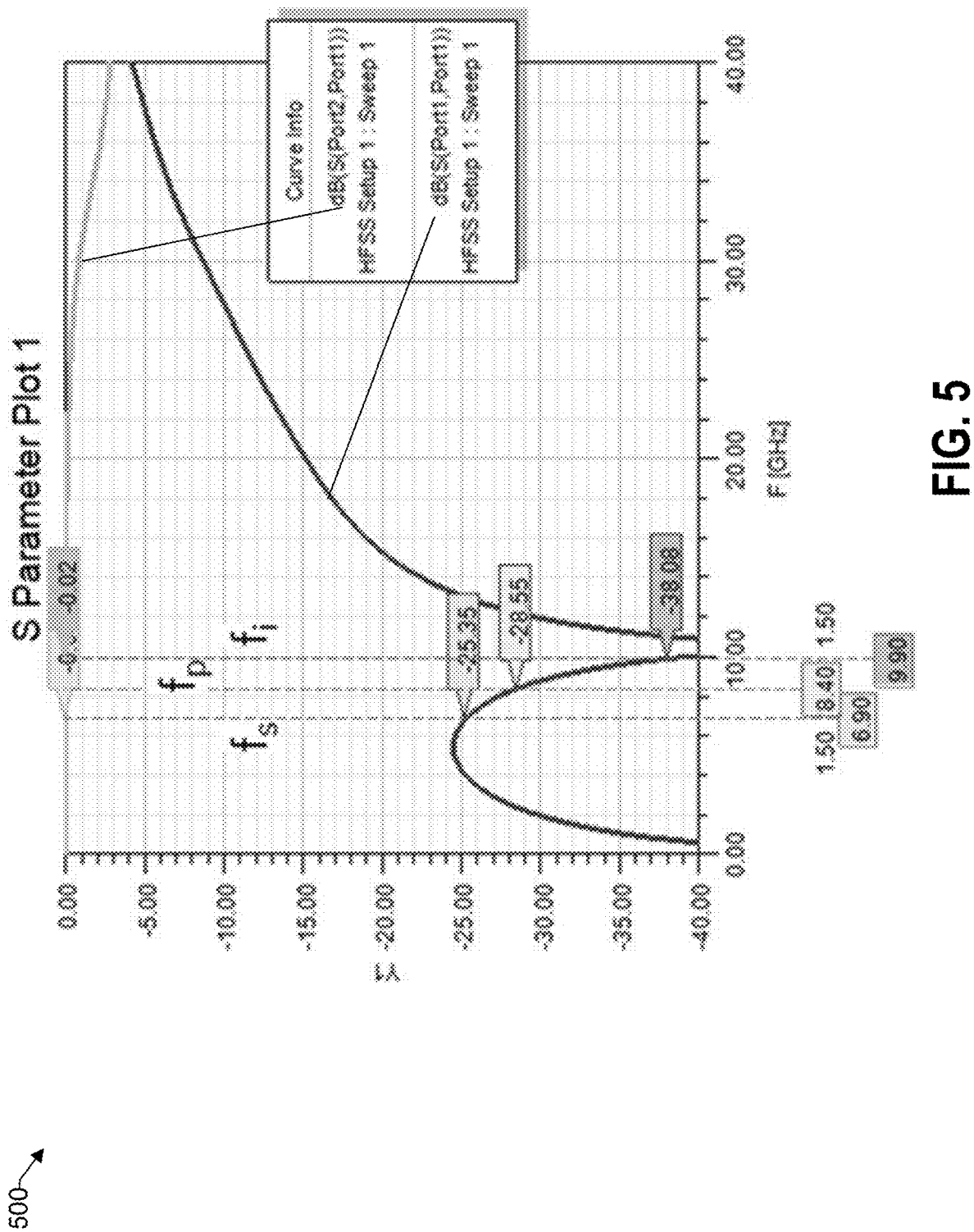
FIG. 5 is a simulation of S-parameters of a bump-bond launch, consistent with an illustrative embodiment.

FIG. 5 is a simulation 500 of S-parameters of a bump-bond launch, consistent with an illustrative embodiment. In the example of FIG. 5, the combined signal and idler bandwidth is set to be 6.9-9.9 GHz where the lowest signal frequency, $f_s$ is 6.9 GHz and with an 8.4 GHz pump frequency the idler frequency, $f_i$ is 9.9 GHz. The bump-bond PCB to chip transition is optimized to reduce reflections to below a predetermined threshold (e.g., minimized) across both the signal and idler bandwidths at the TWPA input and output. The small dimensions of the bump-bond PCB to chip transition have the added benefit of performing well up to the frequencies of the undesired higher order intermodulation products at $2\omega_p+\omega_s$ and at $4\omega_p-\omega_s$ and the third harmonic of the pump tone at $3\omega_p$ which are generated in a TWPA. The interaction of these intermodulation products with the signal and idler degrades the efficiency of a TWPA. Reduced reflections at these intermodulation product frequencies controls the interaction to a manageable level.

In one embodiment, the signal pad size to gap ratio and signal pad taper is made to be a transition at the system impedance (e.g., typically 50 ohms) to minimize reflections at the input and the output of the TWPA.

Figure 6:
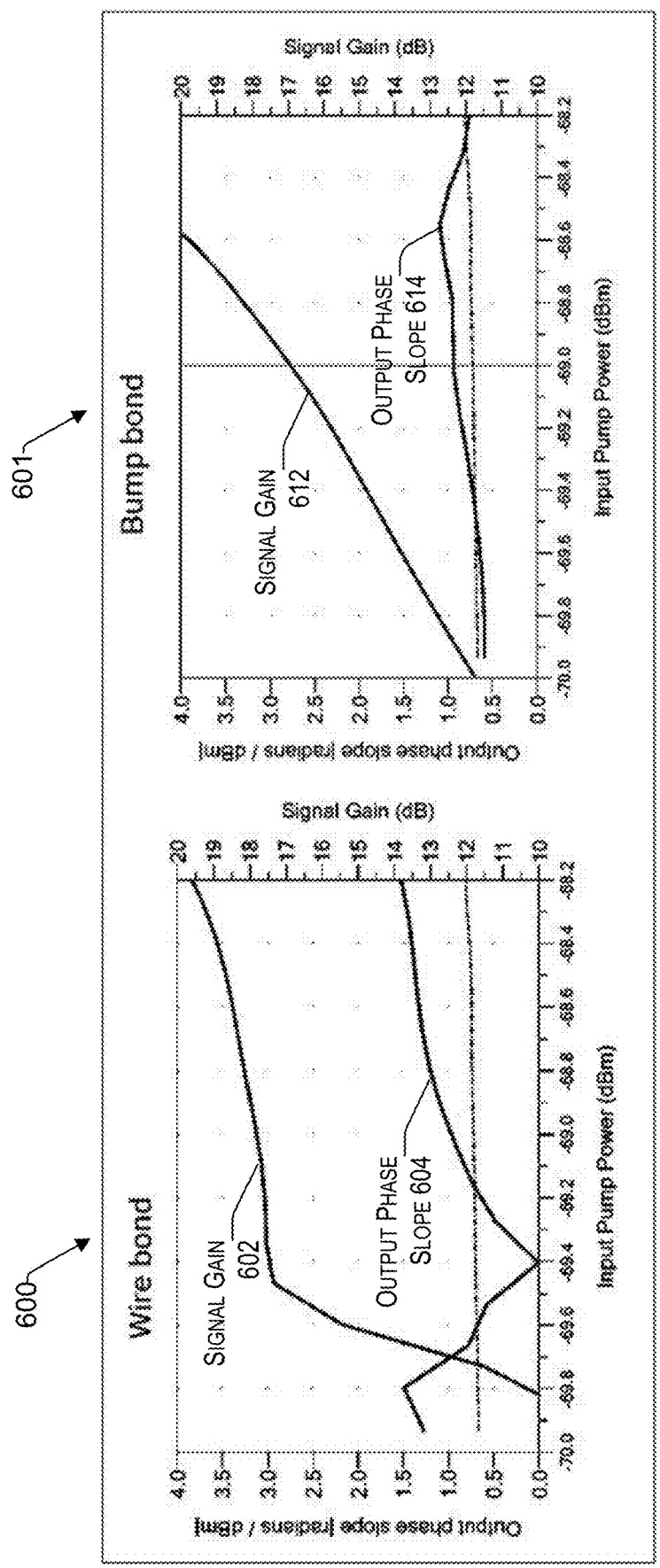
FIG. 6 provides simulation results of signal gain and output phase slope vs. input pump power with a wire bond and bump-bond, respectively, consistent with an illustrative embodiment.

In one embodiment, the bump-bond PCB to chip transition increases the pump power stability of the TWPA and reduces gain ripple compared to a wire-bond transition. This concept can be better understood in view of FIG. 6, which provides a simulation result of signal gain (e.g., 602, 612) and output phase slope (e.g., 604, 614) vs. input pump power with a wire bond 600 and bump-bond 601, respectively, consistent with an illustrative embodiment. More specifically, the simulation results of FIG. 6 illustrate the TWPA performance with both wire-bond 600 and bump-bonds 601 in the presence of an impedance mismatch from external circuitry such a high electron mobility transistor (HEMT) low noise amplifier (LNA) that can be used in a readout chain. The simulation with bump-bonds 601 demonstrates an improved output phase stability (e.g., slope 614 is more constant/linear than the output phase slope 604) as well as a steady increase in signal gain (e.g., signal gain 612 is substantially more linear than signal gain 602) with respect to pump power.

Figure 7:
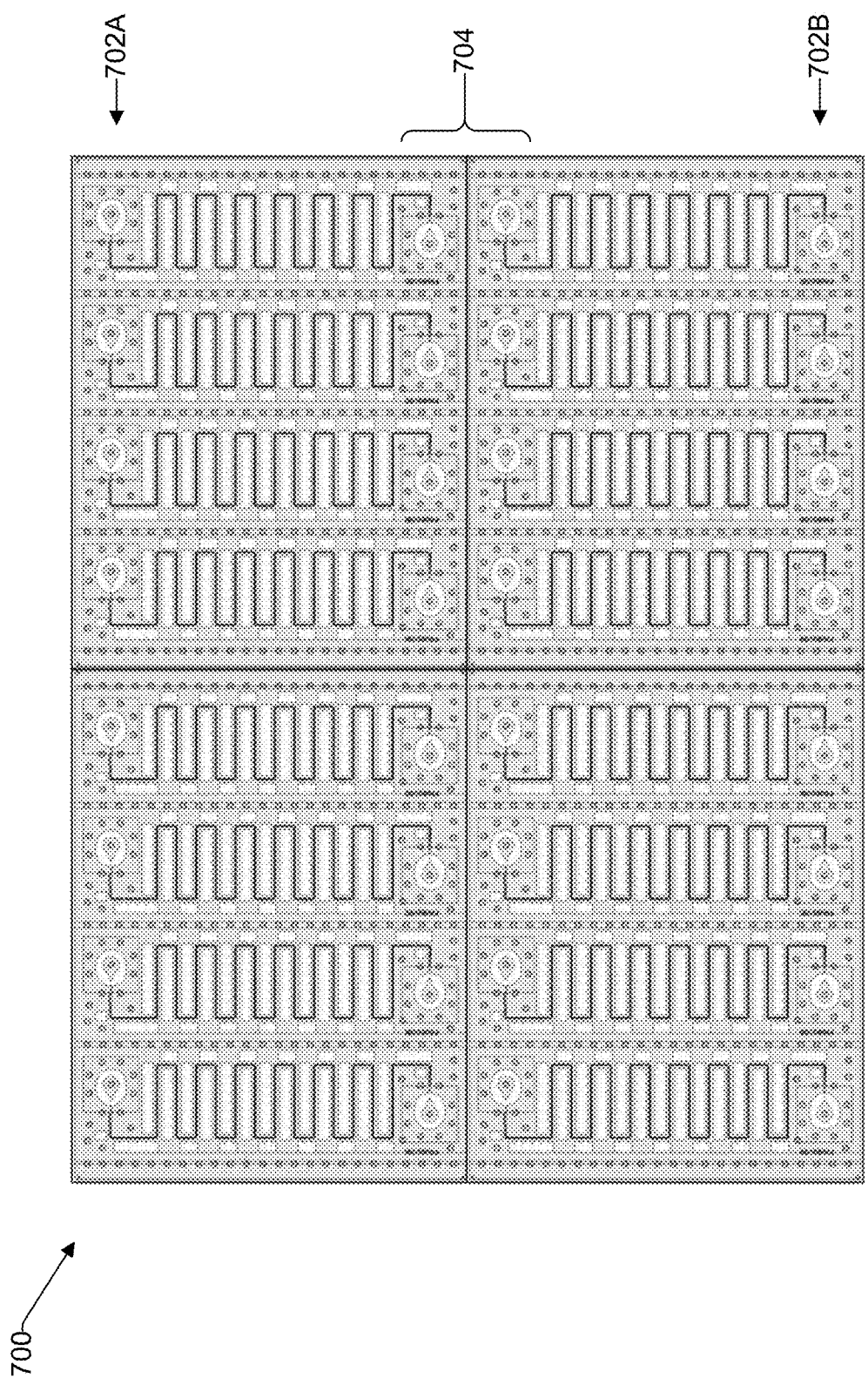
FIG. 7 illustrates a square array of traveling-wave parametric amplifiers having bump-bond interconnects that include I/O connections that are at an interior of the chip, consistent with an illustrative embodiment.

As mentioned previously, unlike wire-bond implementations that rely on electrical interconnects on the periphery of a chip, the teachings herein can accommodate I/O connections nearly anywhere on the chip. In this regard, FIG. 7 illustrates a square array of TWPAs having bump-bond interconnects that include I/O connections that are at an interior 704 (i.e., instead of strictly periphery 702A/B) of the chip 700, consistent with an illustrative embodiment. In this way, a more area efficient architecture having better SNR can be achieved. The configuration of FIG. 7 cannot be readily achieved with wire-bonds since the large stray inductance could lead to a large impedance mismatch at the corresponding I/O connections.

To facilitate the present discussion, JTWPAs are used herein to explain the bump-bond connection between a chip and a substrate. However, there are a variety of devices similar to JTWPAs that can be used for frequency conversion and isolation rather than amplification that are within the scope of the present teachings. For example, the structures described here that enable high density arrays of JTWPAs are also applicable in the fabrication of high-density arrays of traveling-wave frequency converters. Travelling-wave frequency converters can share similar requirements for crosstalk and impedance that are met by bump bonds. Traveling-wave frequency converters can also share similar characteristics with TWPAs in that they have a spectrum of undesired intermodulation products and appear as a thru in the reverse direction.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A superconducting electrical device, comprising:
   a substrate; and
   a chip comprising a group of Josephson junction traveling-wave parametric circuits (JJTWPCs),
      wherein each JJTWPC comprises an input port and an output port,
      wherein the substrate comprises, for each JJTWPC, a respective pair of an input signal pad and an output signal pad that corresponds to the input port and the output port of the JJTWPC, wherein the input signal pad and the output signal pad of the respective pair have a signal pad size to gap ratio and respective signal pad tapers that provide an impedance match between the input port and the output port of the JJTWPC, and
      wherein an electrical connection of the chip to a wiring layer of the substrate comprises, for each of the JJTWPCs:
         a respective signal bump-bond between the input port and the output port of the JJTWPC and the corresponding respective pair of the input signal pad and the output signal pad of the substrate, and
         a respective peripheral ring of ground bumps around the respective signal bump between the JJTWPC and the substrate.

2. The superconducting electrical device of claim 1, wherein the JJTWPCs are traveling-wave parametric amplifiers (TWPAs).

3. The superconducting electrical device of claim 1, wherein the substrate is a multi-layer printed circuit board (PCB).

4. The superconducting electrical device of claim 3, wherein the PCB includes one or more built in directional couplers.

5. The superconducting electrical device of claim 1, wherein a respective pitch between pairs of the signal bump-bonds is less than 10 mm.

6. The superconducting electrical device of claim 5, wherein the pitch is 2 to 3 mm.

7. The superconducting electrical device of claim 1, wherein at least one of the signal bump-bonds of the JJTWPCs is more than 1 mm from an edge of the chip.

8. The superconducting electrical device of claim 7, wherein the at least one of the signal bump-bonds that is more than 1 mm from the edge of the chip has a stray inductance that is less than 1 nH.

9. The superconducting electrical device of claim 1, wherein at least one of the signal bump-bonds of the JJTWPCs are located in at least one of a vertical center row of JJTWPCs or a horizontal center row of JJTWPCs of an array of the group of JJTWPCs of the chip.

10. The superconducting electrical device of claim 1, wherein the JJTWPCs are travelling-wave frequency converters.

11. A method, comprising:
    providing a substrate;
    providing a chip comprising a group of Josephson junction traveling-wave parametric circuits (JJTWPCs),
       wherein each JJTWPC comprises an input port and an output port, and
       wherein the substrate comprises, for each JJTWPC, a respective pair of an input signal pad and an output signal pad that corresponds to the input port and the output port of the JJTWPC, wherein the input signal pad and the output signal pad of the respective pair have a signal pad size to gap ratio and respective signal pad tapers that provide an impedance match between the input port and the output port of the JJTWPC; and
    electrically connecting the JJTWPCs to a wiring layer of the substrate, comprising, for each of the JJTWPCs:
       providing a respective signal bump-bond between the input port and the output port of the JJTWPC and the corresponding respective pair of the input signal pad and the output signal pad of the substrate, and
       providing a respective peripheral ring of ground bumps around the respective signal bump between the JJTWPC and the substrate.

12. The method of claim 11, wherein the JJTWPCs are traveling-wave parametric amplifiers (TWPAs).

13. The method of claim 11, wherein the JJTWPCs are travelling-wave frequency converters.

14. The method of claim 11, wherein the substrate is a multi-layer printed circuit board (PCB).

15. The method of claim 14, wherein the PCB includes one or more built in directional couplers.

16. The method of claim 11, further comprising providing a respective pitch between pairs of the signal bump-bonds of less than 10 mm.

17. The method of claim 11, further comprising providing a respective pitch between pairs of the signal bump-bonds of 2 mm to 3 mm.

18. The method of claim 11, wherein at least one of the signal bump-bonds of the JJTWPCs is more than 1 mm from an edge of the chip.

19. The method of claim 18, wherein the at least one of the signal bump-bonds that is more than 1 mm from the edge of the chip has a stray inductance that is less than 1 nH.

20. The method of claim 11, wherein at least one of the signal bump-bonds of the JJTWPCs are located in at least one of a vertical center row of JJTWPCs or a horizontal center row of JJTWPCs of an array of the group of JJTWPCs of the chip.

* * * * *